US009685984B1

(12) United States Patent
Majumdar et al.

(10) Patent No.: US 9,685,984 B1
(45) Date of Patent: Jun. 20, 2017

(54) FEET FOR MULTI-POSITION COMPUTING DEVICE

(71) Applicant: Microsoft Technology Licensing, LLC, Redmond, WA (US)

(72) Inventors: Shalini Majumdar, Bellevue, WA (US); Spencer Eggert, Redmond, WA (US); Michael Harding, Seattle, WA (US); Timothy G. Escolin, Seattle, WA (US); James Alec Ishihara, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/080,984

(22) Filed: Mar. 25, 2016

(51) Int. Cl.
| | |
|---|---|
| *F16M 11/20* | (2006.01) |
| *H04B 1/3877* | (2015.01) |
| *H05K 5/02* | (2006.01) |
| *A47B 91/00* | (2006.01) |
| *G06F 1/16* | (2006.01) |

(52) U.S. Cl.
CPC ............ *H04B 1/3877* (2013.01); *A47B 91/00* (2013.01); *F16M 11/20* (2013.01); *F16M 2200/08* (2013.01); *G06F 1/166* (2013.01); *H05K 5/0234* (2013.01)

(58) Field of Classification Search
CPC ........ H05K 5/02; H05K 5/0234; A47B 91/00; A47B 2200/0038; F16M 11/00; F16M 11/043; F16M 11/20; F16M 2200/00; F16M 2200/021; F16M 2200/025; F16M 2200/08; G06F 1/166; G06F 1/1616; G06F 1/1675

USPC ................ 248/188, 188.1, 188.2, 188.8, 129
See application file for complete search history.

(56) References Cited

U.S. PATENT DOCUMENTS

| | | | |
|---|---|---|---|
| 5,598,786 A | 2/1997 | Patterson | |
| 5,927,669 A * | 7/1999 | Sassman | A47B 81/06 248/205.2 |
| 6,094,180 A | 7/2000 | Mead | |
| 6,474,614 B2 | 11/2002 | MacEachern | |
| 6,691,961 B2 * | 2/2004 | Solomon | A47B 21/03 248/129 |
| 6,745,986 B1 | 6/2004 | Bright | |

(Continued)

OTHER PUBLICATIONS

"Cool Feet Laptop Cooling Pads", Retrieved at: http://radtech.com/products/coolfeet— on Nov. 30, 2015, 2 pages.

(Continued)

*Primary Examiner* — Duc M Nguyen

(57) ABSTRACT

Feet for a multi-position computing device are described. In one or more implementations, a multi-position computing device is configured to include a base and a display device connected to the base by a hinge mechanism. The hinge mechanism is operable to position the display device into multiple positions relative to the base including at least an upright position and a laid-down position. An arrangement of feet on the underside of the base is designed to facilitate dynamic movement of the device into the multiple positions. The arrangement of feet includes sliding feet that engage for sliding of the base across a surface when pressure is applied to the hinge mechanism for transitions between positions. The arrangement of feet also includes tacky feet that engage and resist sliding of the base across the surface in the absence of pressure applied to the hinge mechanism.

23 Claims, 9 Drawing Sheets

(56) References Cited

U.S. PATENT DOCUMENTS

| | | | |
|---|---|---|---|
| 7,532,463 B2 | 5/2009 | Jacobs | |
| 7,784,752 B2 | 8/2010 | Tang | |
| 8,191,852 B1 | 6/2012 | Wheatley | |
| 8,213,177 B2* | 7/2012 | Uttermann | H05K 5/0234 248/188.8 |
| 8,737,065 B2 | 5/2014 | Farrow | |
| 8,887,903 B2* | 11/2014 | Diebel | A45C 11/00 206/305 |
| 9,052,873 B2* | 6/2015 | Murakata | G06F 1/1626 |
| 2002/0056797 A1* | 5/2002 | Solomon | A47B 21/03 248/346.01 |
| 2005/0247832 A1* | 11/2005 | Cho | F16M 11/04 248/133 |
| 2006/0192070 A1 | 8/2006 | Chan | |
| 2008/0251663 A1 | 10/2008 | Tracy | |
| 2008/0316692 A1* | 12/2008 | Jacobs | F16M 13/00 361/679.55 |
| 2009/0316355 A1* | 12/2009 | Jones | G06F 1/1632 361/679.55 |
| 2010/0059648 A1* | 3/2010 | Zhang | F16M 11/10 248/371 |
| 2010/0149752 A1* | 6/2010 | Lian | G06F 1/1616 361/679.59 |
| 2011/0310536 A1* | 12/2011 | Uttermann | H05K 5/0234 361/679.01 |
| 2012/0243153 A1 | 9/2012 | Utterman | |
| 2015/0036289 A1 | 2/2015 | Aurongzeb | |
| 2015/0062810 A1* | 3/2015 | Ho | H05K 5/0234 361/679.59 |

OTHER PUBLICATIONS

"Breadboard Feet and Seats", Retrieved at: http://www.thorlabs.us/newgrouppage9.cfm?objectgroup_id=1867— on Nov. 30, 2015, 3 pages.

Kunesh, "The Roost Makes Working From Your Laptop a Bit Better on Your Back", Retrieved at: http://www.macgasm.net/2014/03/28/roost-makes-working-laptop-bit-better-back/, Mar. 28, 2014, 3 pages.

* cited by examiner

FEET FOR MULTI-POSITION COMPUTING DEVICE

BACKGROUND

Computing devices and operating systems have advanced to provide a wide range of functionality for different interaction scenarios and using different device form factors (e.g., tablets, laptops, mobile phones, desktop, etc.). Along with advances in computing technology, the design and availability of convertible computing devices that may be used in multiple different positions or modes has also increased. For example, tablets and all-in-one device are available that enable interaction in traditional computing/viewing modes with the device positioned upright as well as in drawing or canvas modes in which the device is laid-down at least partially for interactions with the device display surface. For such multi-position devices, developers seek to make it easy for users to transition the device between different modes. However, feet used with computing device are traditionally tacky feet (e.g., rubber or sticky composite) designed to hold the device in position. Consequently, traditional feet arrangements may inhibit dynamic movement into different positions to enable corresponding interaction scenarios.

SUMMARY

Feet for a multi-position computing device are described. In one or more implementations, a multi-position computing device is configured to include a base and a display device connected to the base by a hinge mechanism. The hinge mechanism is operable to position the display device into multiple positions relative to the base including at least an upright position and a laid-down position. An arrangement of feet on the underside of the base is designed to facilitate dynamic movement of the device into the multiple positions. The arrangement of feet includes sliding feet that engage for sliding of the base across a surface when pressure is applied to the hinge mechanism for transitions between positions and movement across surfaces. The arrangement of feet also includes tacky feet that engage and resist sliding of the base across the surface in the absence of pressure applied to the hinge mechanism.

Accordingly, the base slides forward on the sliding feet as the hinge mechanism is used to pull the display device downward into the laid-down position and then the base is held in place by the tacky feet during interaction in the laid-down position. When the hinge mechanism is manipulated to return the display device to the upright position, the sliding feet are engaged again and the base slides backward for interaction in the upright position. The dynamic movement of the device between positions is made possible due in part to differences in coefficients of frictions associated with materials employed for the arrangement of feet and lever action of the hinge mechanism to selectively engage the sliding feet during transitions.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Figure 1:
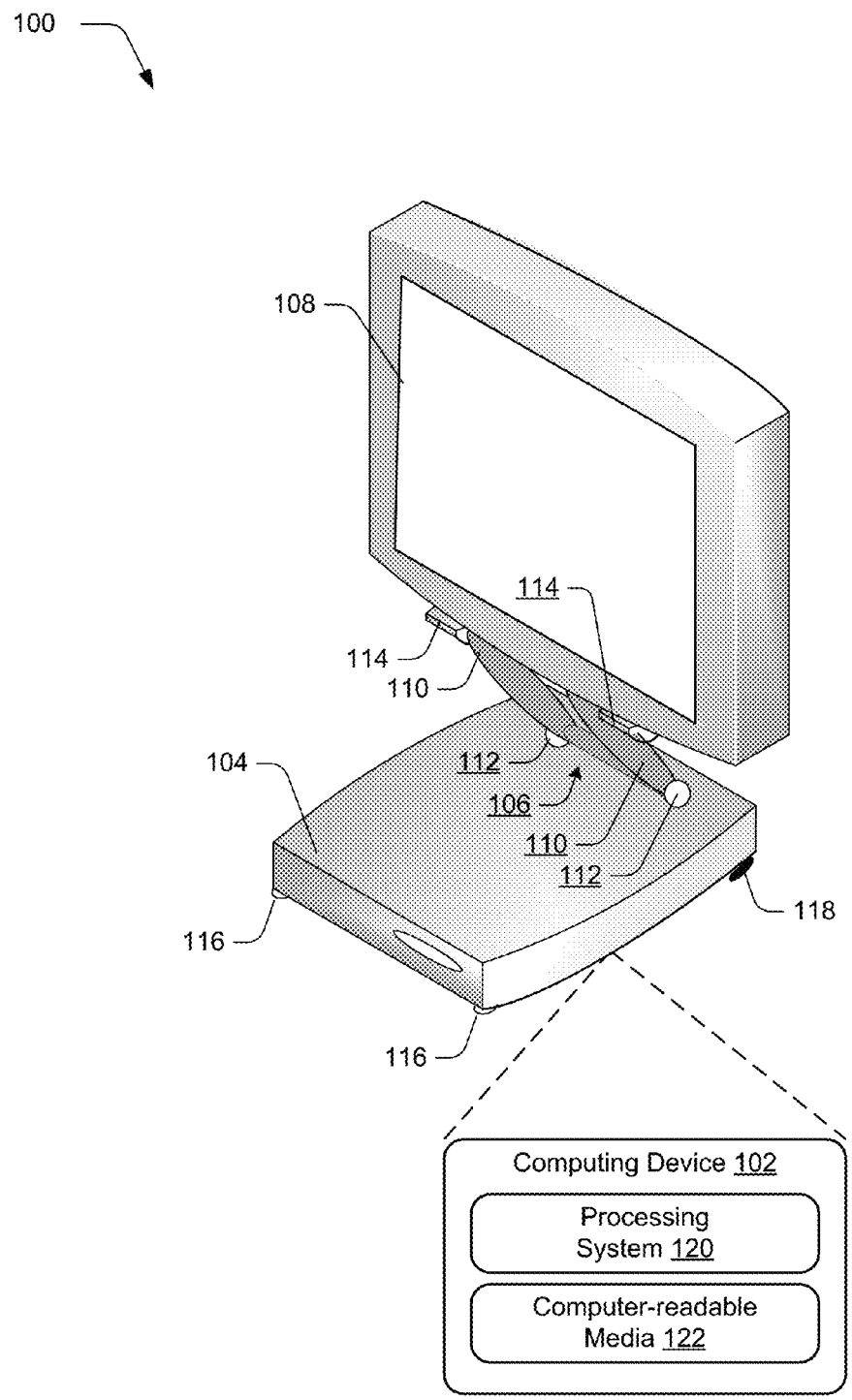
FIG. 1 is an illustration of an environment in an example implementation that is operable to employ the techniques described herein.

Feet designs traditionally used with computing devices employ tacky feet (e.g., rubber or sticky composite) designed to hold the device in position. Consequently, traditional feet arrangements may inhibit dynamic movement into different positions to enable corresponding interaction scenarios.

Feet for a multi-position computing device are described that are designed to facilitate dynamic movement of the device into multiple positions. In one or more implementations, a multi-position computing device is configured to include a base and a display device connected to the base by a hinge mechanism. The hinge mechanism is operable to position the display device into multiple positions relative to the base including at least an upright position and a laid-down position. An arrangement of feet on the underside of the base includes sliding feet that engage for sliding of the base across a surface when pressure is applied to the hinge mechanism for transitions between positions. The arrangement of feet further includes tacky feet that engage and resist sliding of the base across the surface in the absence of pressure applied to the hinge mechanism.

Accordingly, the base slides forward on the sliding feet as the hinge mechanism is used to pull the display device downward into the laid-down position and the base is then held in place by the tacky feet during interaction in the laid-down position. When the hinge mechanism is manipulated to return the display device to the upright position, the sliding feet are engaged again and the base slides backward for interaction in the upright position. The dynamic movement of the device between positions is made possible due in part to differences in coefficients of frictions associated with materials employed for the arrangement of feet and lever action of the hinge mechanism to selectively engage the sliding feet during transitions. The feet also facilitate moving of the device forward and back along a surface without transitioning of the device between different device positions.

Feet for a multi-position computing device as described herein make it easier for users to move a device around on a desk or other surface and/or transition the device into different positions. The feet may be configured to enable different interaction modes such as a viewing mode and a canvas/drawing mode, which increases the ways in which users are able to use the device. The feet facilitate relatively effortless transitions between different modes, which can increase user interest in and satisfaction with the device.

In the discussion that follows, a section titled "Operating Environment" is provided that describes an example environment suitable to employ the feet for a multi-position computing device techniques described herein. Following this, a section titled "Feet Arrangement Details" describes example techniques, devices, arrangements, and details in accordance with one or more implementations. Last, a section titled "Example System" describes example computing systems and devices that can employ feet arrangements described herein in accordance with one or more implementations.

Operating Environment

FIG. 1 is an illustration of an environment 100 in an example implementation that is operable to employ techniques described herein. The illustrated environment 100 includes a computing device 102 implemented as a multi-position device designed to assume a variety of configurations. As illustrated, for instance, the computing device 102 assumes a "desktop" configuration in which the computing device is configured in an upright position to be placed on a desk or other surface and used for traditional desktop computing. As described in detail below in relation to FIG. 2, the computing device 102 can also assume a "canvas" or "drawing" configuration in which the computing device is configured in a laid-down position for use as a table-top or surface computing device.

Generally, the computing device 102 may be configured as a various kinds of devices, such as a desktop computer, a mobile station, an entertainment appliance, a set-top box communicatively coupled to a display device, a wireless phone, a game console, and so forth. The computing device may provide a wide range of device functionality and be capable of communicating over a network to access resources available via service providers and other devices. The computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as a remote control and set-top box combination, an image capture device and a game console configured to capture gestures, and so on.

In the example of FIG. 1, the computing device 102 includes a base 104 that is communicatively and physically connected (e.g., rotationally) via a hinge mechanism 106 to a display device 108. Various devices, components, interfaces, and circuitry to provide various computing functionality of the computing device 102 may be implemented in the base 106, as part of the display device 108, and/or by the base 104 and display device 108 in combination. For instance, the base 104 may be configured as a chassis including electronic componentry to provide at least some processing and memory resources for the computing device. The base 104 may also be weighted to counterweight the display device and prevent tipping during transitions between the multiple positions. Alternatively, the base may act as primarily as a weighted stand that provides little or no computing functionality.

The display device 108 may include a variety of functionality, such as to include touchscreen functionality to recognize gestures and other inputs. Rotation of the display device 108 in relation to the base 104 of may be utilized to support a variety of different functionality and operational modes, as described above and below. In implementations, the display device 108 is configured as a slate computing device that includes a processing system, memory, an operating system and/or other computing functionality. In addition or alternatively, the display device 108 may be detachable from the base. In configurations as a slate device, the processing system and memory of the display device 108 are configured to execute an operating system and provide other computing functionality when detached from the base.

The hinge mechanism 106 may be configured in various ways to connect the base 104 to the display device 108 and enable manipulation of the display device 108 into multiple positions relative to the base 108. The multiple positions included at least an upright position and a laid-down position as described in this document. Various intermediate positions are also contemplated in some scenarios. For instance, the hinge mechanism 106 may be configured to support approximately 180 degrees of rotation or more of the display device. The hinge mechanism 106 may be configured as a friction hinge such that a desired angle may be set and is then maintained. Although represented as being exposed, the hinge mechanism 106 may be at least partially embedded in the base 106 and even hidden within a base structure. In one or more implementations, the hinge mechanism 106 may be configured to permit the display device 108 to move into two or more defined positions in addition to the rotation, e.g., permit movement of the display up and down in relation to the base. For instance, the display device 108 may be connected to the hinge in a manner that allows the display device 108 to move downward when rotated to a laid-down position that permits touch inputs to be provided in a more comfortable manner to a user. Likewise, the hinge may enable movement of the display device upward when rotated into an upright position suitable for using the display as a monitor for viewing and other traditional desktop computing interactions. The hinge may be configured to catch and "lock-in" to positions at different set angles to establish the two or more defined positions. Alternatively, the hinge may support continuous positioning of the display at any angle through a range of motion supported by the hinge.

In the example implementation represented in FIG. 1, the hinge mechanism 106 includes a pair of arms 110, which are connected to the base 104 via first pivotable members 112 and connected to the display device 108 by pivotable connector members 114. The arms 110 and pivotable members 112, 114 are configured to enable positioning of the display device 108 into multiple positions relative to the base 104 for different types of interactions and operational modes. The arms may be mechanically operated by a user to raise, lower, and rotate the display device. The hinge mechanism 106 may also be implemented using electronic assistance devices, such as actuators, clutch mechanisms, and sensors designed to provide at least some of the force required to raise, lower, and rotate the display device and thereby reduce the amount of force a user has to apply to transition the device into different positions. The apparent force that the user applies to move the device is then approximately constant and close to zero (e.g., so that the device seems to float and move with little effort). A variety of other examples are also contemplated without departing from the spirit and scope thereof.

In connection with transitioning of a multi-position device into different positions, an arrangement of feet may be included with the computing device to facilitate dynamic movement of the device. The arrangement of feet includes feet formed from different materials having different coefficients of friction. As represented in FIG. 1, the feet may include one or more tacky feet 116 and one or more sliding feet 118 that are disposed on an underside of the base 104. Siding feet 118 engage for sliding of the base across a surface when pressure is applied to the hinge mechanism for transitions between positions. Tacky feet 116 engage to resist sliding of the base across the surface in the absence of pressure applied to the hinge mechanism. Generally, a single material having a desired coefficient of friction is selected and used for each individual foot in the arrangement. In addition or alternatively, at least some feet in the arrangement are configured to have a combination of both tacky and slippery portions. In this case, different portions of a foot made from different materials are designed to contact the surface at different times (e.g., as pressure applied to the foot changes), which changes how readily the foot slides on the surface.

The computing device 102 is further illustrated as having a processing system 120 with one or more processors and devices (e.g., CPUs, GPUs, microcontrollers, hardware elements, fixed logic devices, etc.) and one or more computer-readable media 122. One example of a computing system that can represent various systems and/or devices including the computing device 102 is shown and described below in relation to FIG. 8. Computer-readable media 122 can include both "computer-readable storage media" and "communication media," examples of which can also be found in the discussion of the example computing system of FIG. 8.

The computing device 102 may further include an operating system and other applications that reside on the computer-readable media 122 and which are executable by the processing system 120. The processing system 120 may retrieve and execute computer-program instructions from applications to provide a wide range of functionality to the computing device, including but not limited to gaming, office productivity, email, media management, printing, networking, web-browsing, and so forth. A variety of data and program files related to the applications can also be included, examples of which include games files, office documents, multimedia files, emails, data files, web pages, user profile and/or preference data, and so forth.

Feet Arrangement Details

Figure 2:
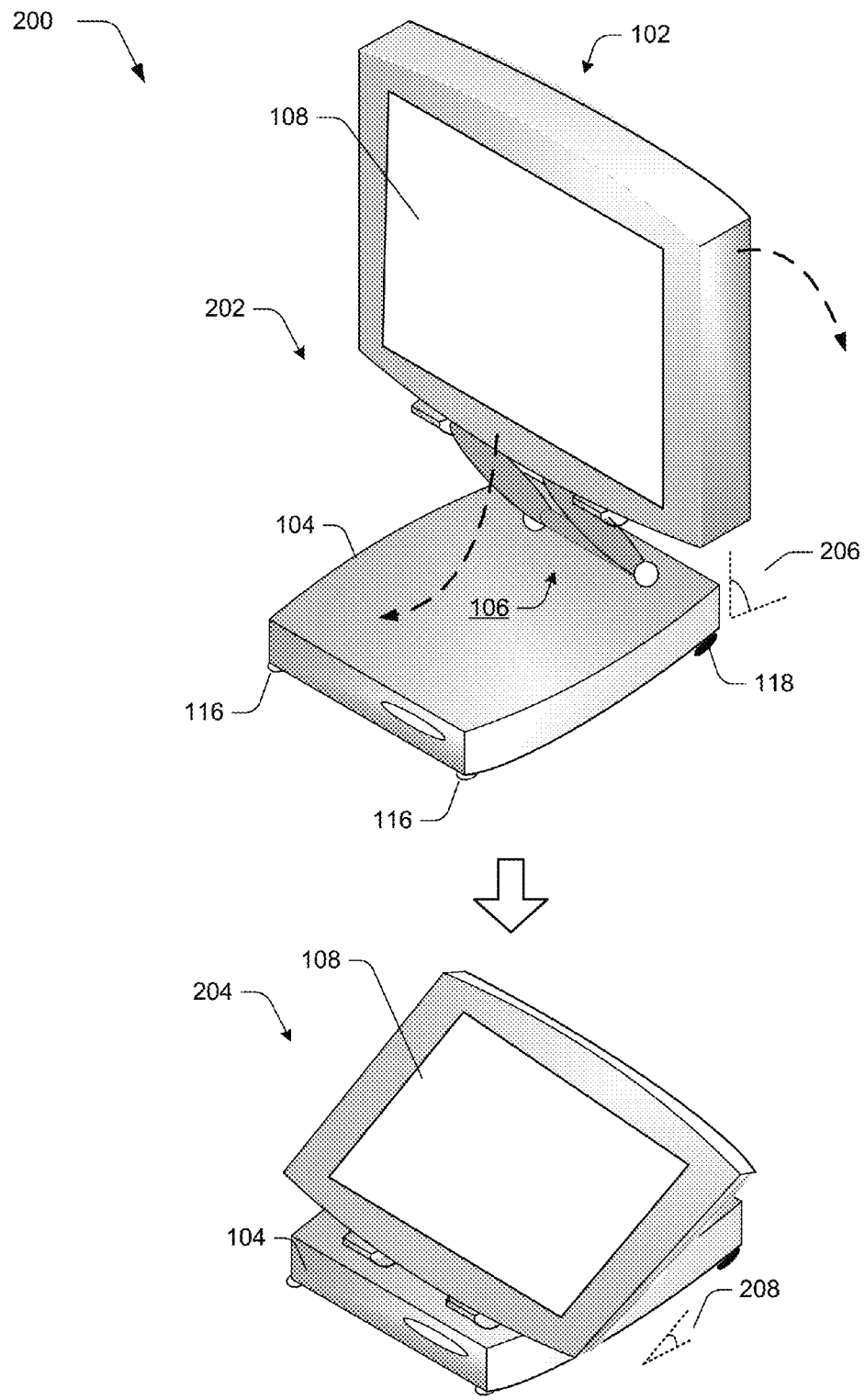
FIG. 2 depicts an example scenario in which movement of the display device in relation to the base is represented in accordance with one or more implementations.
Figure 3A:
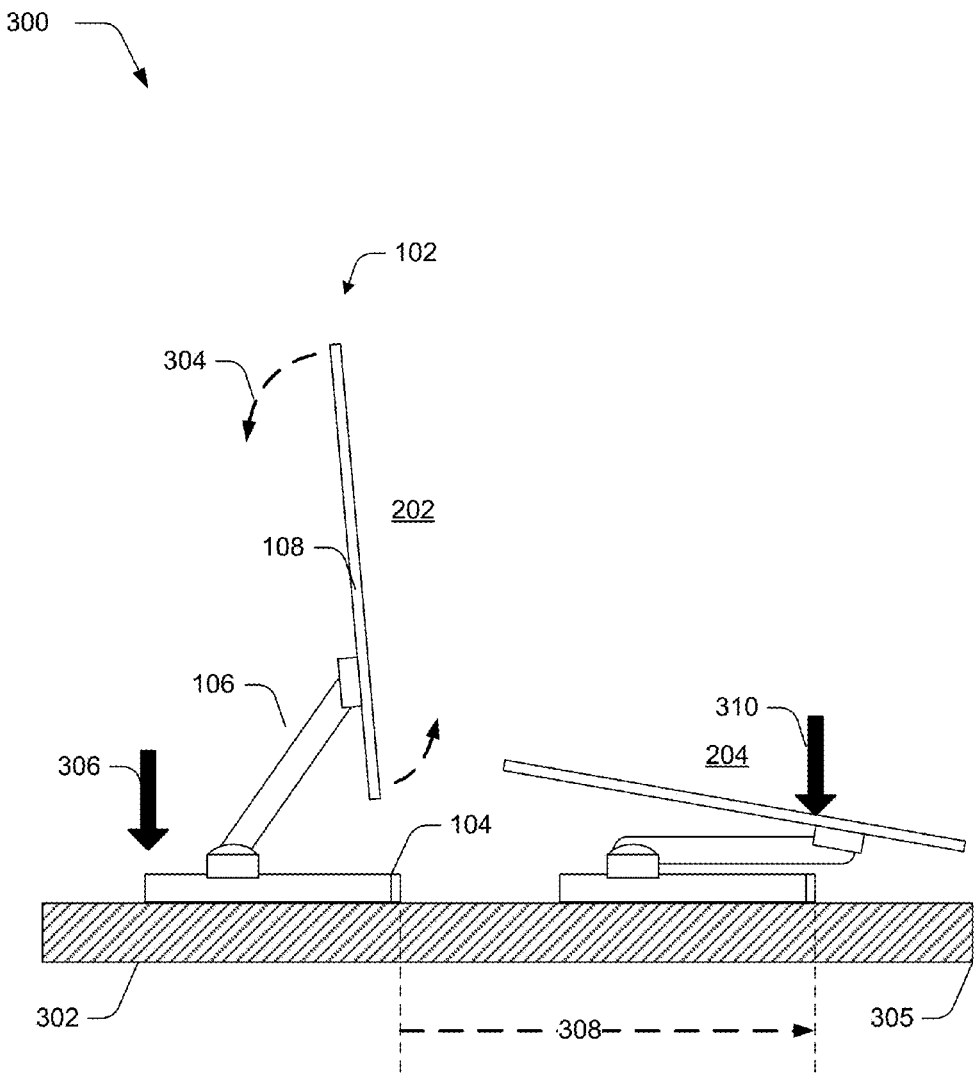
FIG. 3A depicts a side view of a transition of a device between an upright position and a laid-down position in accordance with one or more implementations.
Figure 3B:
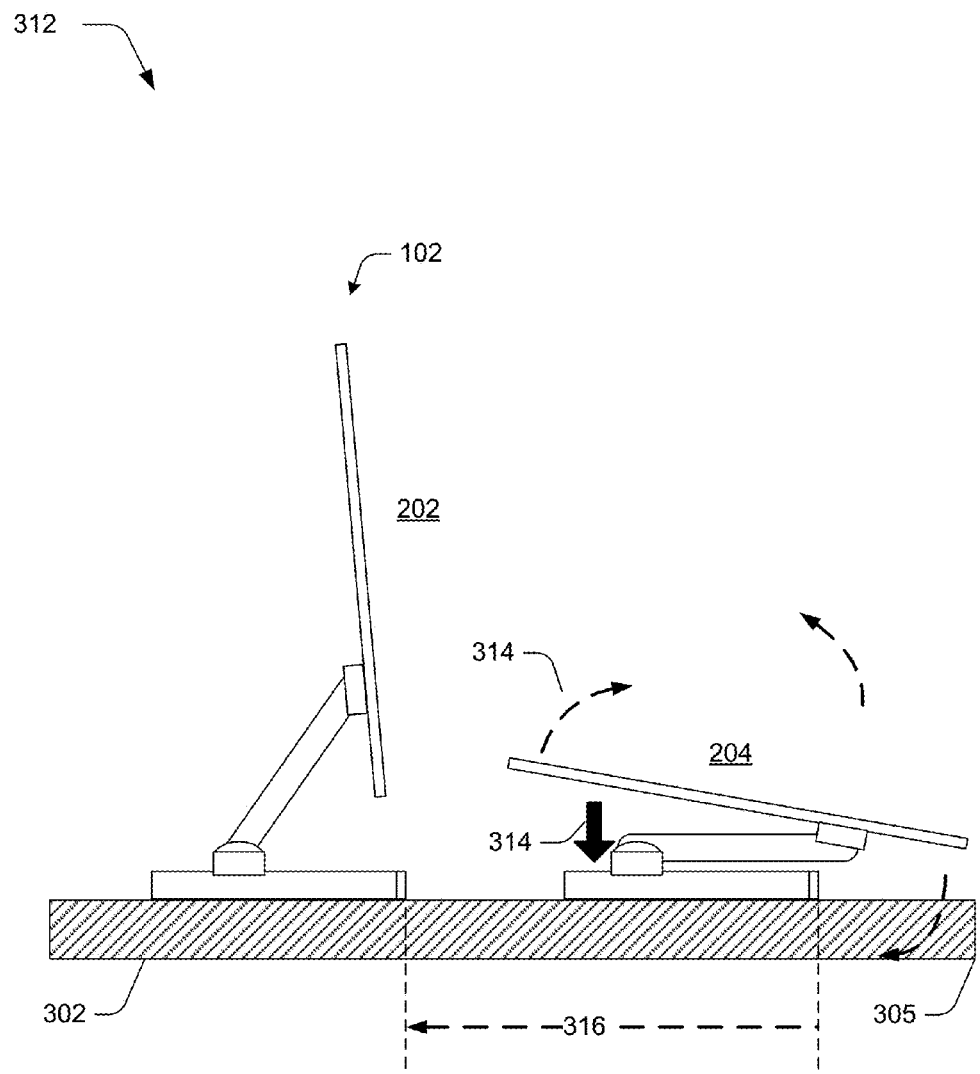
FIG. 3B a side view of a reverse transition of the device of FIG. 3A from the laid-down position back to the upright position in accordance with one or more implementations.

To further illustrate details regarding feet arrangements for a multi-position computing device, consider now the examples of FIGS. 2, 3A, and 3B, which represent example scenarios in which a device is transitioned into different positions. In particular, FIG. 2 depicts generally at 200 an example scenario in which movement of the display device 108 in relation to the base 104 is represented. In the illustrated example, the display device 108 is shown from a "back side" of the device (e.g., side opposite the viewing screen on a "front side") as being positioned in relation to the base 108 into different example positions 202, 204. Display device 108 may be transitioned back and forth between the example positions 202, 204 (and other positions in-between) using the techniques described herein.

In the position 202, the display device 108 is illustrated as generally disposed in an "upright" configuration such that a user may view the display device 108 in a manner that mimics interaction with a desktop computer. In the upright position, the display device is raised to an upright angle 206 above the base for vertical interaction. Generally, the upright angle 206 formed between the plane of the display on the backside and the base or surface on which the device rests is forty-five degree or greater. For example, the upright angle 206 in the illustrated example is approximately ninety degrees.

The display device 108 may also be rotated using the hinge mechanism 106 to "lay down" over the base and/or against the surface on which the base rests as represented by position 204. Position 204 may be thought of as a "canvas" or "drawing" configuration in which a user may interact with touchscreen functionality of the display device 114, e.g., via gestures, a stylus, touch input, and so on. In this way, a user may comfortably interact with the display device to perform handwriting, drawing, painting, graphic design, and so on. In the laid-down position, the display device 108 is lowered to a relatively flat angle 208 over the base 104 for horizontal interaction. Generally, the flat angle 208 formed between the plane of the display on the backside and the base or surface on which the device rests is less than forty-five degrees. For example, the flat angle 208 in the illustrated example is approximately thirty degrees.

In this context, FIG. 3A depicts generally at 300 a side view of a transition of a device between an upright position and a laid-down position. Further, FIG. 3A represents sliding of the base 104 that occurs in conjunction with the transition due to an arrangement of feet included with the base. For example, a computing device 102 in position 204 (e.g., upright) is represented as resting upon a surface 302 such a desk or table. From this position, interaction 304 represented by dashed arrows to rotate the display outward and down is used to cause the computing device to assume the position 204 (e.g., laid-down). Interaction 304 may represent grasping of the display by a hand(s) of a user to engage the hinge mechanism 106 and thereby rotate and lower the display device 108 into position 204. Interaction 304 may further include pulling of the device forward towards an edge 305 of the surface 302 so the device is move closer in position 204 to a user on the far side of the edge 305.

Pressure that is applied due to the interaction 304 is transferred by lever action of one or more arms included in the hinge mechanism to drive sliding feet 118 into the surface 302 upon which the computing device rests. In the depicted arrangement, pressure represented by arrow 306 is transferred via the hinge mechanism 106 generally to a back side of the base (e.g., side opposite the viewing screen). This causes the base 104 to tilt slightly onto its back edge and particularly onto feet disposed on the back edge. In implementations, the feet disposed on the back edge are configured as sliding feet 118 as described herein that facilitate sliding of the base when the feet are engaged. Consequently, the pulling action included as part of interaction 304 is effective to cause the base 104 to slide on the sliding feet 118 a distance forward along the surface 302 as represented by the arrow 308.

When the device is in position 204 with the base 104 moved forward towards the edge 305, a user is able to more easily interact with the device using touch, a stylus, or other interaction from "over-the-top" of the display. Such interaction that occurs on the top of the display generally applies pressure represented by arrow 310 to a front side of the base 104. This causes the base 104 to tilt slightly onto its front edge and in particular onto feet disposed along the front edge. In implementations, the feet disposed on the front edge of the base are configured as tacky feet 116 described herein that resist sliding of the base and act to hold the base in place when the feet are engaged.

FIG. 3B depicts generally at 312 a side view of a reverse transition of the device of FIG. 3A from the laid-down position back to the upright position. Here, interaction 314 represented by dashed arrows to engage the hinge mechanism 106 causes the computing device to return to the position 202 (e.g., upright). Interaction 314 may represent grasping of the display by a hand(s) of a user to rotate the display device 108 upward and at the same time apply pressure to engage sliding feet 118 disposed along a back edge of the base 104 and push the base backwards. Accordingly, pressure represented by arrow 314 is effective to tilt the base 104 slightly back, engage the sliding feet 118, and cause the base to slide on the sliding feet back from the edge 305 a distance as represented by arrow 316.

Although FIGS. 3A and 3B represent sliding that occurs in connection with transitioning of the device between positions, the feet may also facilitate moving of the device forward and back along a surface without transitioning of the device between different device positions. For instance, grasping of the display provides and pulling or pushing lateral produce sufficient pressure to engage sliding feet 118 disposed along a back edge. This may occur with or without also rotating the display up or down to change positions. Accordingly, arrangements of feet as discussed herein are effective to simply slide a device easily back and forth across a desk of other surface.

Figure 4:
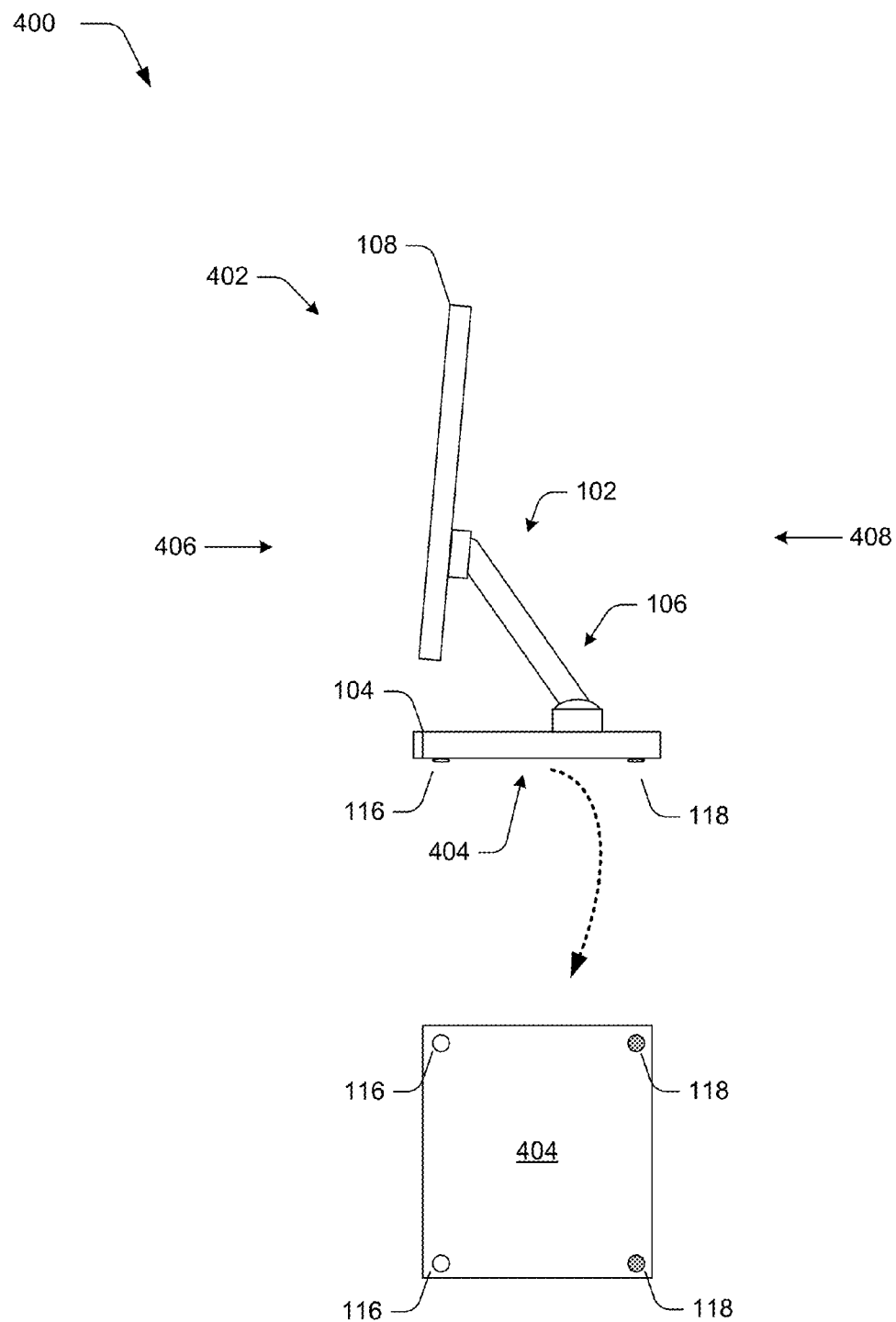
FIG. 4 depicts an example arrangement of feet for an example computing device in accordance with one or more implementations.

Details and examples regarding arrangements of feet for a multi-position computing device are discussed in relation to the examples of FIGS. 4-7. In particular, FIG. 4 depicts generally at 400 an example arrangement of feet for an example computing device. A side view 402 is illustrated of a computing device 102 having a base 104 and a display device 108 connected by a hinge mechanism 106 as discussed in relation to FIGS. 1-3. The example computing device is further illustrated as including an arrangement of feet on an underside 404 of the base 104 for the device.

An arrangement of feet may be configured in various ways to facilitate dynamic movement of a multi-position device as discussed herein. Generally, the arrangement of feet includes one or more tacky feet 116 and one or more sliding feet 118 that are disposed on an underside of the base 104. In implementations, the tacky feet 116 are arranged along an edge of the base toward a front side 406 of the device. The front side 406 correspond to the side of the device from which interaction of the device typically occurs and the side to which the screen of the display device is pointed. Tacky feet 116 placed toward the front side 406 of the device are configured to keep the base from sliding when used in a laid-down position and otherwise in the absence of pressure applied to the hinge.

In implementations, the sliding feet 118 are arranged along an edge of the base opposing the tacky feet 116 toward a back side 408 of the device. The back side 408 corresponds to the side of the device opposite the screen of the display device is pointed. The back side 408 may include various ports and connectors of the device, such as USB ports, a power cord connection, A/V outputs and so forth. Sliding feet 118 placed toward the back side 408 of the device are configured to enable sliding of the base when pressure is applied to the hinge to transition the device between different positions.

Sliding feet 118 and tacky feet 116 may be formed using various materials and may also be arranged in various patterns and configurations. Generally, the sliding feet have a coefficient of friction lower than a coefficient of friction for the tacky feet. As represented in FIG. 4, the feet are configured to protrude at least partially from the underside 404 of the base such that feet contact a surface upon which the computing device 102 is placed, and the computing device 102 rests on top of the feet.

Different types of feet may be made from different materials, such as different thermoplastic, rubber, or metal materials having different coefficients of friction. For example, the tacky feet 116 may be formed as rubber feet made from natural or synthetic rubber material. The tacky feet may also be formed using a relatively soft and tacky thermoset plastic or elastomer, and example of which is Arnitel®. The tacky feet may be configured as cylindrical or disk-shaped feet designed to be adhered to the base and/or inserted into complementary slots or holes formed in the base.

Sliding feet 118 may also be implemented in various ways. For example, the sliding feet may be configured as plastic or metal roller bearings or rollers. Sliding feet 118 may also be configured as cylindrical or disk-shaped feet designed to be adhered to the base and/or inserted into complementary slots or holes formed in the base. The sliding feet 118 may be formed using a relatively hard thermoset plastic, and example of which is Derlin® (polyoxymethylene).

As noted, various patterns and configurations may be employed for the feet in different scenarios. By way of example and not limitation, the base depicted in the example of FIG. 4 is rectangular shaped. Here, the arrangement of feet includes a pair of sliding feet placed in corners of the rectangle along one side of the base (e.g., the back side) and a pair of tacky feet placed in corners of the rectangle along an opposing side of the base (e.g., the front side). In other arrangements, additional or fewer feet may be employed and other patterns may be used. For example, feet may be configured as larger bands or strips that extend along respective edges. In this case, a single sliding foot and/or a single tacky foot may replace respective pairs of feet. Moreover, additional feet may be disposed in a pattern between the corners and/or in interior locations of the underside 404. Each foot of the arrangement of feet may be further configured to act as a pivot, such that the base is base rotatable around each foot. This makes it easy for a user to spin the computing device into different positions for viewing, collaboration with others, demonstrations, and so forth. Naturally, the base 104 may also be implemented using different shapes in which case the arrangement of feet may be adapted accordingly to correspond to the shape of the base.

Figure 5:
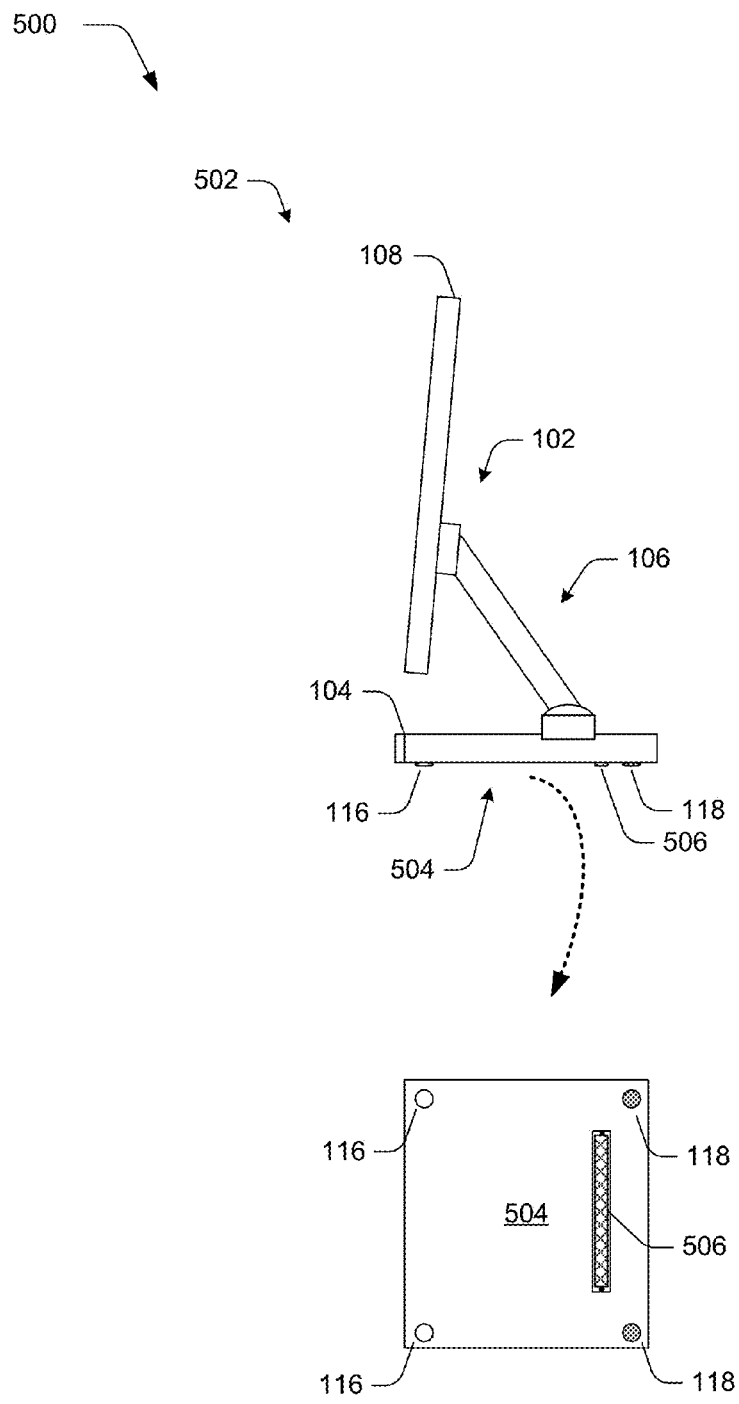
FIG. 5 depicts an additional example arrangement of feet for an example computing device that employs a stop mechanism in accordance with one or more implementations.

FIG. 5 depicts generally at 500 an additional example arrangement of feet for an example computing device that employs a stop mechanism in accordance with one or more implementations. A side view 502 is again illustrated of a computing device 102 having a base 104 and a display device 108 connected by a hinge mechanism 106 as discussed in relation to FIGS. 1-3. In this example, the underside 504 of the base includes feet that may be arranged in various ways as previously discussed. In the depicted example, pairs of tacky and sliding feet are arranged at corners of the rectangular base in accordance with the example discussed in relation to FIG. 4.

The arrangement of feet in the example of FIG. 5 additionally includes a stop mechanism 506 disposed on the base. The stop mechanism 506 may be configured in various ways to control a distance through which the base 104 travels across a surface during transitions between multiple positions. For instance, the stop mechanism 506 may be implemented to set and control the sliding distance represented by arrow 308 in FIG. 3A and arrow 316 in FIG. 3B. The stop mechanism 506 enables dynamic sliding of the base a consistent distance forward and back so the device is located at desired positions for interaction in different configurations. The stop mechanism 506 helps prevent a user from inadvertently pulling the device over an edge 305 of the surface 302 on which the device rest or pushing the device too far backward.

Various configurations of a stop mechanism 506 are contemplated. For example, the stop mechanism 506 may be implemented as one or more rollers configured to travel a set distance. The set distance may correspond to a lateral distance across a surface and/or a set number of revolution of the rollers. The rollers are designed to have limited travel in both forward and backwards rotation. This creates a limit range of travel for the roller after which the roller is locked in place using a clutch, pin, ratchet, or other locking mechanism. At this point, the roller provides resistance to prevent the based from sliding further in the direction of travel. Thus, the base 104 is able to slide forward on sliding feet 118 for the distance established by the rollers and then is prevented for traveling further forward. The base 104 may then be slid backwards for the distance established by the rollers at which point the roller is again locked in place to prevent further travel backwards.

As represented in FIG. 5, the stop mechanism 506 is represented as a single roller configured to travel a set distance disposed on the underside 504 of the base 104. In this example, the roller is embedded in a rectangular cutout within the base and protrudes out from the base approximately the same amount as the feet. The roller is positioned on the interior of the base and configured to roll in forward and backward directions towards the front side and back side of the device respectively. The roller may also operate to restrict sideways movement of the device, which helps prevent the base from twisting laterally. Naturally, one or more rollers may be employed and the location of the rollers may be changed in different implementations.

Various alternative implementations of the stop mechanism 506 are also contemplated. For example, the stop mechanism 506 may be implemented as a stop bar or additional feet elements that "pop-out" after a set distance of sliding. In another example, the stop mechanism 506 may employ stop elements (feet, bars, stabilizers, etc.) that are engaged and disengaged based on travel of the hinge mechanism 106. In this case, various stop elements may be mechanically connected to the hinge mechanism and configured to contact a surface 302 on which the device rest to establish the upright and laid-down positions as well as to restrict sliding to a set distance. In yet another example, rather than having a separate component, the stop mechanism 506 may be integrated as part of the feet included in the arrangement of feet. For instance, sliding feet 118 may be implemented as rollers or bearings that are designed to have a limited travel range. Consequently, the sliding feet 118 act as a stop mechanism 506 in addition to facilitating sliding.

Additionally, the stop mechanism 506 may include an adjuster to enable a user to set and adjust the travel distance.

For example, an adjustment dial or gear may establish how far a stop mechanism 506 in the of a roller is able to rotate and consequently may be used to customize the travel distance. Generally, the adjuster is configured to set boundaries for either or both of forwards and backwards travel of the base.

It is noted that the example computing device 102 discussed in the preceding examples is representative of various different configurations of multi-position devices that may take advantage of feet arrangements and concepts discussed herein. It is contemplated that the techniques described herein may be applied in the context of various kinds of devices including various desktop configurations, laptops, tablet/slate devices, and mobile form factors. By way of example and not limitation, an example in which the feet arrangements and techniques described herein are applied in the context of a slate device is shown and described in relation to FIG. 6.

Figure 6:
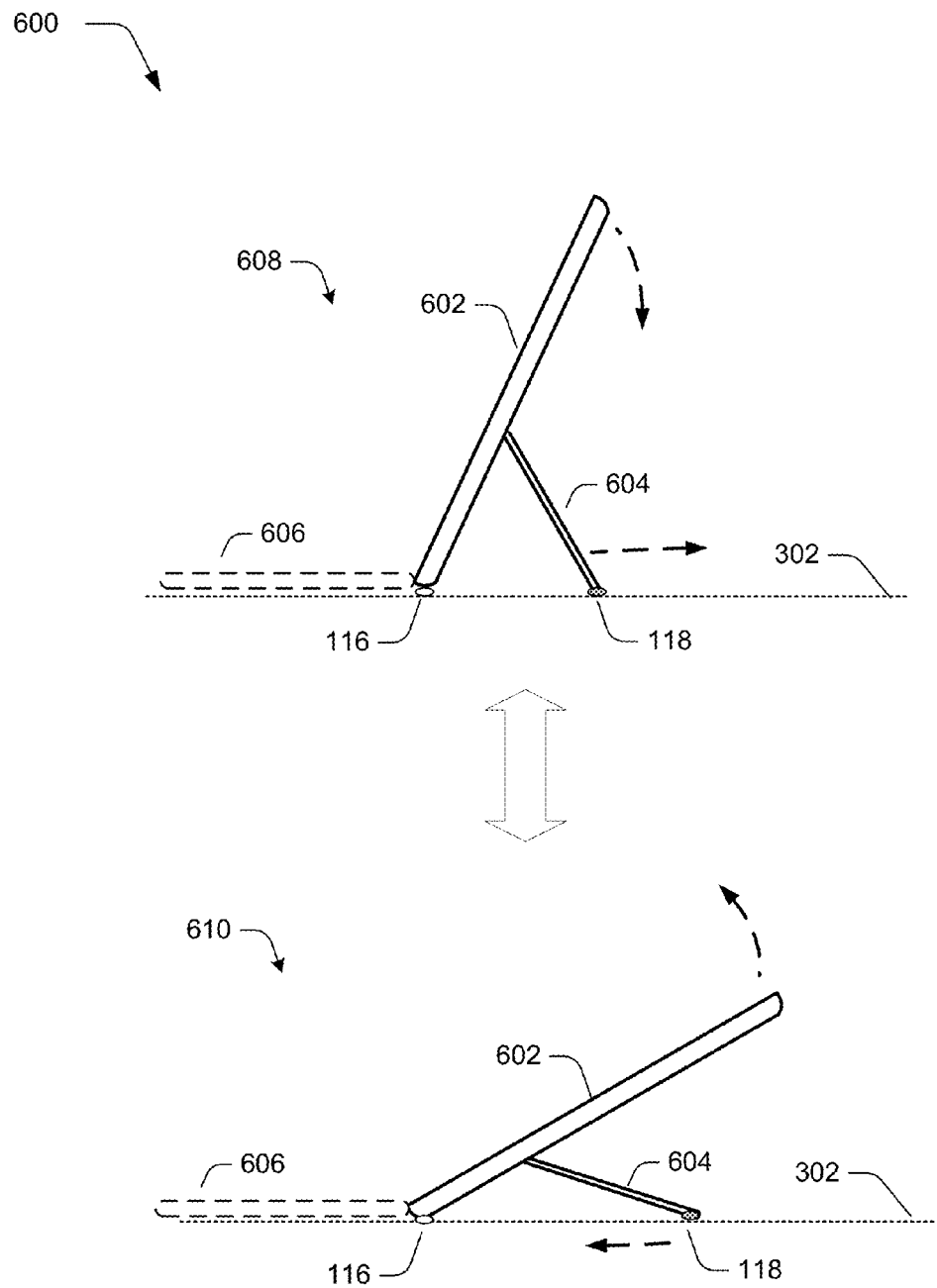
FIG. 6 depicts an example slate device that employs an arrangement of feet to facilitate transitions between positions in accordance with one or more implementations.

In particular, FIG. 6 depicts generally at 600 an example slate device that employs an arrangement of feet to facilitate transitions between positions in accordance with one or more implementations. In this example, a side view of a computing device 602 having a slate form factor is shown. The computing device 602 employs and adjustable kickstand 604 that acts as a hinge mechanism 106 to enable the computing device 602 to attain various different positions. As represented by dashed lines, the computing device 602 may optionally include an accessory device 606 that can be physically and communicatively coupled to the computing device 602. The accessory device 606 may be configured in various ways, such as being implemented as a keyboard, a cover, a combined keyboard cover, a wireless interface, a battery device, a game controller, and other accessories that provide "add-on" functionality.

The computing device 602 is represented in FIG. 6 as transitioning between an upright position 608 and a laid-down position 610 through operation of the kickstand 604. For example, sliding the kickstand outward from the computing device 602 causes the device to tilt down and assume the laid-down position 610. Sliding the kickstand inward toward the computing device 602 causes the device to tilt up and assume the upright position 608. Transitions between these positions and various intermediate positions can be facilitated by employing feet as described in this document.

In particular, the example in FIG. 6 represents one or more tacky feet 116 as being disposed along an edge of the computing device 602 that rest on the surface 302. Tacky feet 116 may be implemented in various ways, such as feet placed in the corners, a tacky strip that extends along the edge, and so forth. Sliding feet 118 are depicted as being disposed along an edge of the kickstand 604 that is in contact with the surface 302 and supports the device. Sliding feet 118 may also be implemented in various ways, such as feet placed in the corners, a strip of hard plastic that extends along the edge, and so forth. In accordance with concepts described herein, the sliding feet 118 assist sliding of kickstand 604 to assume different positions. Additionally, when a user grasps the computing device 602 device at the sides and pulls or pushes, pressure is transferred to the sliding feet 118 via the kickstand 604, which makes it easy to slide the device forward and back. When the device is being used in the laid-down position 610 or the upright position 608 (e.g., when pressure is not being applied to the sliding feet), the tacky feet 116 provide resistance that keeps the device in place and prevents sliding.

Arrangements of feet in accordance with the preceding examples may employ different configurations of feet made from different materials and having different coefficients of friction. In implementations, individual feet are formed having a consistent composition. In other words, slippery feet are formed using slippery material and tacky feet are formed using a tacky material. In this approach, slippery feet are separate from tacky feet.

Alternatively, at least some feet in the arrangement are configured to have a combination of both tacky and slippery portions. In this case, different portions of a foot made from different materials are designed to contact the surface at different times (e.g., as pressure applied to the foot changes), which changes how readily the foot slides on the surface. For example, a foot may be configured as a flexible bubble having layers or rings of different compositions. The different layers or rings have different coefficients of friction. The bubble deforms under pressure, which changes the surface areas of the different layers or rings that are in contact with the desk, table, or other surface upon which the computing device rests. Consequently, a single foot can act as slippery foot that facilitates sliding in some cases and as a tacky foot that provides resistance in other cases. By way of example and not limitation, an example of a multi-composition foot having both tacky and slippery portions is described in relation to FIG. 7.

Figure 7:
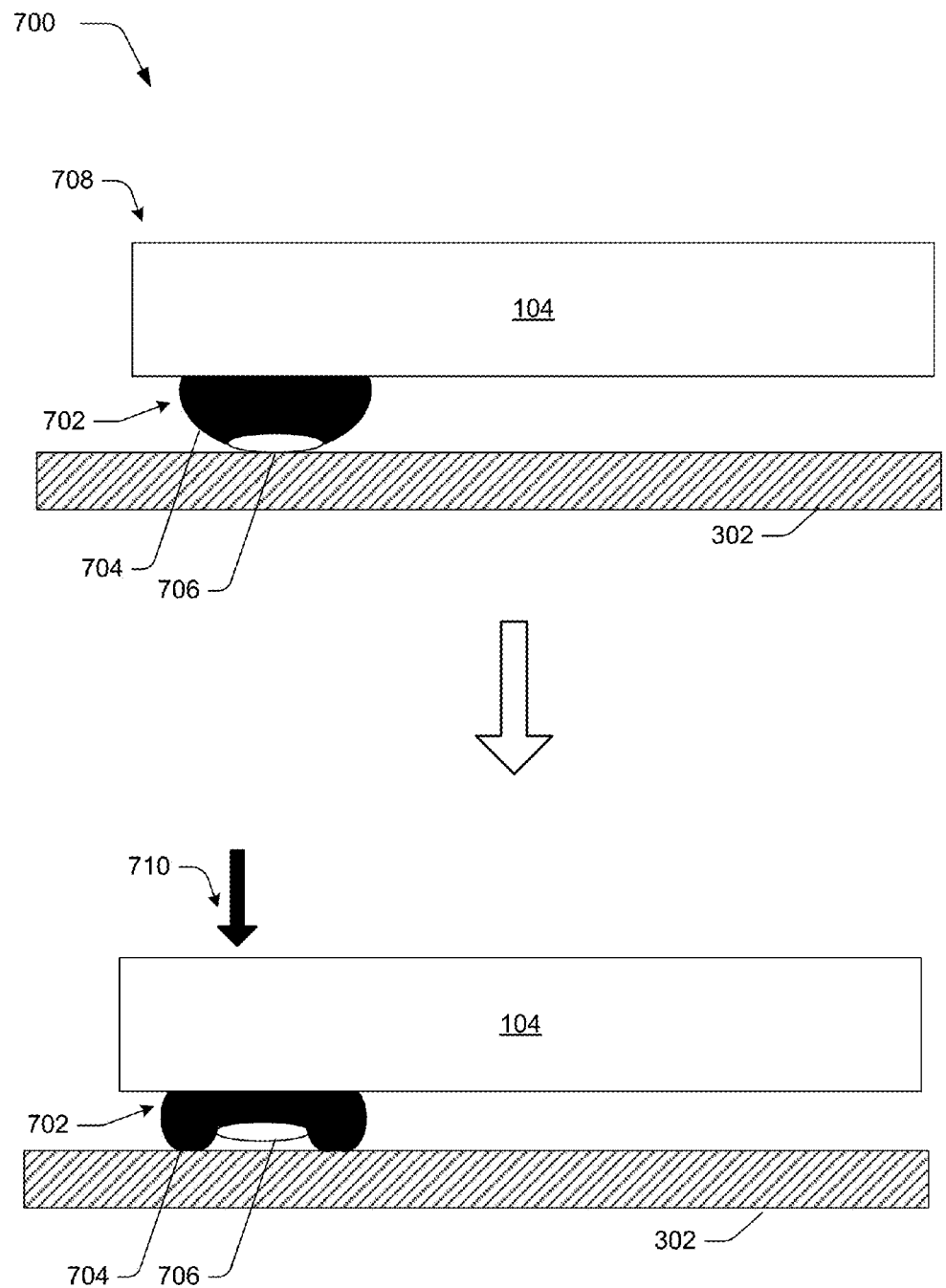
FIG. 7 depicts an example representation of a multi-composition foot in accordance with one or more implementations.

In particular, FIG. 7 depicts generally at 700 an example representation of a multi-composition foot in accordance with one or more implementations. In the depicted example, a foot 702 in the form of a flexible bubble is illustrated. The foot 702 includes bands of different materials including a slippery band 704 and a tacky band 706. The slippery band 704 has a coefficient of friction that is lower than a coefficient of friction of the tacky band 706. Various materials, layouts, and configurations for feet as described previously herein may be employed in the context of multi-composition feet represented by the example of FIG. 7.

In the absence of applied pressure as represented at 708, the foot 702 "stands-up" and the majority of contact between the foot and the surface 302 occurs with the tacky band 706. Consequently, the foot 702 operates as a tacky foot 116 under these conditions. When pressure is applied as represented at 710, the foot 702 is compressed and deforms, which changes the contact points of the foot with the surface. In implementations, the majority of contact switches from majority contact with the tacky band 706 to majority contact with the slippery band 704. For purposes of illustration, the deformation and switching of contact points is exaggerated in FIG. 7. Consequently, the foot 702 operates as a slippery foot 118 under these conditions.

Example System and Device

Figure 8:
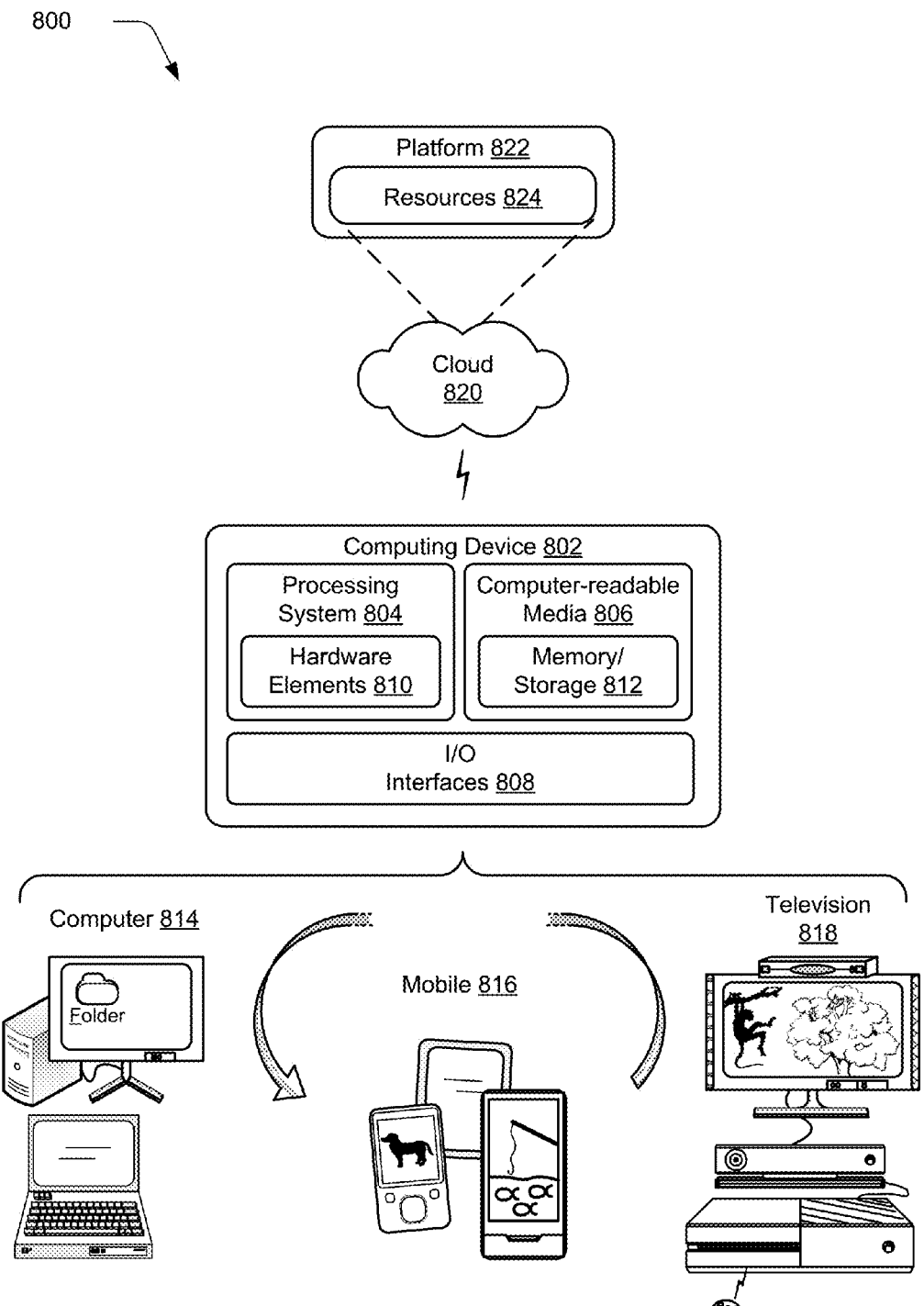
FIG. 8 illustrates an example system including various components of an example device that can be implemented as any type of computing device as described with reference to FIGS. 1-7 to implement the techniques described herein.

FIG. 8 illustrates an example system generally at 800 that includes an example computing device 802 that is representative of one or more computing systems and/or devices that may implement the various techniques described herein. The computing device 802 may be, for example, a server of a service provider, a device associated with a client (e.g., a client device), an on-chip system, and/or any other suitable computing device or computing system.

The example computing device 802 as illustrated includes a processing system 804, one or more computer-readable media 806, and one or more I/O interface 808 that are communicatively coupled, one to another. Although not shown, the computing device 802 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 804 is representative of functionality to perform one or more operations using hardware. Accordingly, the processing system 804 is illustrated as including hardware element 810 that may be configured as processors, functional blocks, and so forth. This may include implementation in hardware as an application specific integrated circuit or other logic device formed using one or more semiconductors. The hardware elements 810 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 806 is illustrated as including memory/storage 812. The memory/storage 812 represents memory/storage capacity associated with one or more computer-readable media. The memory/storage component 812 may include volatile media (such as random access memory (RAM)) and/or nonvolatile media (such as read only memory (ROM), Flash memory, optical disks, magnetic disks, and so forth). The memory/storage component 812 may include fixed media (e.g., RAM, ROM, a fixed hard drive, and so on) as well as removable media (e.g., Flash memory, a removable hard drive, an optical disc, and so forth). The computer-readable media 806 may be configured in a variety of other ways as further described below.

Input/output interface(s) 808 are representative of functionality to allow a user to enter commands and information to computing device 802, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 802 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 802. By way of example, and not limitation, computer-readable media may include "computer-readable storage media" and "computer-readable signal media."

"Computer-readable storage media" refers to media and/or devices that enable persistent storage of information in contrast to mere signal transmission, carrier waves, or signals per se. Thus, computer-readable storage media does not include transitory media or signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" refers to a signal-bearing medium that is configured to transmit instructions to the hardware of the computing device 802, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 810 and computer-readable media 806 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 810. The computing device 802 may be configured to implement particular instructions and/or functions corresponding to the software and/or hardware modules. Accordingly, implementation of a module that is executable by the computing device 802 as software may be achieved at least partially in hardware, e.g., through use of computer-readable storage media and/or hardware elements 810 of the processing system 804. The instructions and/or functions may be executable/operable by one or more articles of manufacture (for example, one or more computing devices 802 and/or processing systems 804) to implement techniques, modules, and examples described herein.

As further illustrated in FIG. 8, the example system 800 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 800, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 802 may assume a variety of different configurations, such as for computer 814, mobile 816, and television 818 uses. Each of these configurations includes devices that may have generally different constructs and capabilities, and thus the computing device 802 may be configured according to one or more of the different device classes. For instance, the computing device 802 may be implemented as the computer 814 class of a device that includes a personal computer, desktop computer, a multi-screen computer, laptop computer, netbook, and so on.

The computing device 802 may also be implemented as the mobile 816 class of device that includes mobile devices, such as a mobile phone, portable music player, portable gaming device, a tablet computer, a multi-screen computer, and so on. The computing device 802 may also be implemented as the television 818 class of device that includes devices having or connected to generally larger screens in casual viewing environments. These devices include televisions, set-top boxes, gaming consoles, and so on.

The techniques described herein may be supported by these various configurations of the computing device 802 and are not limited to the specific examples of the techniques described herein. This functionality may also be implemented all or in part through use of a distributed system, such as over a "cloud" 820 via a platform 822 as described below.

The cloud 820 includes and/or is representative of a platform 822 for resources 824. The platform 822 abstracts underlying functionality of hardware (e.g., servers) and software resources of the cloud 820. The resources 824 may include applications and/or data that can be utilized while computer processing is executed on servers that are remote from the computing device 802. Resources 824 can also include services provided over the Internet and/or through a subscriber network, such as a cellular or Wi-Fi network.

The platform 822 may abstract resources and functions to connect the computing device 802 with other computing devices. The platform 822 may also serve to abstract scaling of resources to provide a corresponding level of scale to encountered demand for the resources 824 that are implemented via the platform 822. Accordingly, in an interconnected device embodiment, implementation of functionality described herein may be distributed throughout the system 800. For example, the functionality may be implemented in part on the computing device 802 as well as via the platform 822 that abstracts the functionality of the cloud 820.

EXAMPLE IMPLEMENTATIONS

Example implementations of techniques described herein include, but are not limited to, one or any combinations of one or more of the following examples:

Example 1

A computing device comprising: a base and a display device connected to the base by a hinge mechanism operable to position the display device into multiple positions relative to the base, the multiple positions including at least an upright position and a laid-down position; an arrangement of feet disposed on an underside of the base, the arrangement of feet including: one or more sliding feet configured to engage and facilitate sliding of the base across a surface upon which the computing device rests when pressure is applied to the hinge mechanism to transition between the upright position and the laid-down position; and one or more tacky feet configured to engage and resist sliding of the base across the surface when pressure is applied to the display device in the laid-down position.

Example 2

A computing device as described in any one or more of the examples in this section, wherein the sliding feet have a coefficient of friction lower than a coefficient of friction for the tacky feet.

Example 3

A computing device as described in any one or more of the examples in this section, wherein the pressure applied to hinge mechanism is transferred to the sliding feet by lever action of one or more arms included in the hinge mechanism to drive the sliding feet into the surface upon which the computing device rests.

Example 4

A computing device as described in any one or more of the examples in this section, wherein the display device is configured as a tablet computing device that is detachable from the base and includes a processing system and memory configured to execute an operating system when detached from the base.

Example 5

A computing device as described in any one or more of the examples in this section, wherein the base is weighted to counterweight the display device and prevent tipping during transitions between the multiple positions.

Example 6 a computing device as described in any one or more of the examples in this section, wherein the base includes a stop mechanism configured to control a distance through which the base travels across the surface during transitions between the multiple positions.

Example 7

A computing device as described in any one or more of the examples in this section, wherein the stop mechanism comprises a roller configured to travel a set distance disposed on the underside of the base.

Example 8

A computing device as described in any one or more of the examples in this section, wherein the base is configured as a chassis including electronic componentry to provide at least some processing and memory resources for the computing device.

Example 9

A computing device as described in any one or more of the examples in this section, wherein the sliding feet comprises roller bearings.

Example 10

A computing device as described in any one or more of the examples in this section, wherein the tacky feet comprise rubber feet.

Example 11

A computing device as described in any one or more of the examples in this section, wherein the sliding feet and tacky feet are formed from different thermoplastic materials having different coefficients of friction.

Example 12

A computing device as described in any one or more of the examples in this section, wherein each foot of the arrangement of feet is further configured to act as a pivot, such that the base is base rotatable around each foot.

Example 13

A computing device as described in any one or more of the examples in this section, wherein the base is rectangular and the arrangement of feet includes sliding feet placed in corners along a side of base and tacky feet placed in corners along an opposing side of the base.

Example 14

A computing device as described in any one or more of the examples in this section, wherein the display device and base are physically and communicatively coupled one to another via the hinge mechanism.

Example 15

A computing device as described in any one or more of the examples in this section, wherein: the upright position comprises a position in which the display device is raised to an upright angle above the base for vertical interaction; and the laid-down position comprises a position in which the display device is lowered to a flat angle over the base for horizontal interaction.

Example 16

A system comprising: a base and a display device connected to the base by a hinge mechanism operable to position the display device into multiple positions relative to the base; an arrangement of feet disposed on an underside of the base, the arrangement of feet configured to: facilitate sliding of the base across a surface upon which the computing device rests when pressure is applied to the hinge mechanism to transition between the multiple positions; and resist sliding of the base across the surface in the absence of pressure applied to the hinge mechanism.

Example 17

A system as described in in any one or more of the examples in this section, wherein the arrangement of feet includes: portions of sliding material engaged when pressure is applied to the hinge mechanism during transitions between the multiple positions to enable sliding of the base forward and back across the surface; portions of tacky material engaged to keep the base from sliding in the absence of pressure applied to the hinge mechanism.

Example 18

A system as described in any one or more of the examples in this section, wherein at least one foot of the arrangement of feet includes both sliding material and tacky material, the tacky material in contact with the surface in the absence of applied pressure, the at least one foot deformable under applied pressure to drive the sliding material into contact with the surface thereby enabling the sliding of the base.

Example 19

An apparatus comprising: a base and a display device connected to the base by a hinge mechanism operable to position the display device into multiple positions relative to the base, the multiple positions including at least an upright position and a laid-down position; one or more sliding feet arranged on an underside of the base along a rear edge of the base opposite from a front side of the apparatus, the sliding feet configured to engage and facilitate sliding of the base across a surface upon which the apparatus rests when pressure is applied to the hinge mechanism to transition between the upright position and the laid-down position; one or more tacky feet arranged on the underside of the base along a front edge of the base on the front side of apparatus, the tacky feet configured to engage and resist sliding of the base across the surface in the absence of pressure applied to the hinge mechanism; and a stop mechanism configured to limit a distance the base is able to travel across the surface during transitions between the multiple positions.

Example 20

The apparatus as described in any one or more of the examples in this section, wherein the sliding feet and tacky feet are formed from different thermoplastic materials having different coefficients of friction.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A computing device comprising:
   a base and a display device connected to the base by a hinge mechanism operable to position the display device into multiple positions relative to the base, the multiple positions including at least an upright position and a laid-down position;
   an arrangement of feet disposed on an underside of the base, the arrangement of feet including:
   one or more sliding feet configured to engage and facilitate sliding of the base across a surface upon which the computing device rests when pressure is applied to the hinge mechanism to transition between the upright position and the laid-down position; and
   one or more tacky feet configured to engage and resist sliding of the base across the surface when pressure is applied to the display device in the laid-down position.

2. A computing device as described in claim 1, wherein the sliding feet have a coefficient of friction lower than a coefficient of friction for the tacky feet.

3. A computing device as described in claim 1, wherein the pressure applied to the hinge mechanism is transferred to the sliding feet by lever action of one or more arms included in the hinge mechanism to drive the sliding feet into the surface upon which the computing device rests.

4. A computing device as described in claim 1, wherein the display device is configured as a tablet computing device that is detachable from the base and includes a processing system and memory configured to execute an operating system when detached from the base.

5. A computing device as described in claim 1, wherein the base is weighted to counterweight the display device and prevent tipping during transitions between the multiple positions.

6. A computing device as described in claim 1, wherein the base includes a stop mechanism configured to control a distance through which the base travels across the surface during transitions between the multiple positions.

7. A computing device as described in claim 6, wherein the stop mechanism comprises a roller configured to travel a set distance disposed on the underside of the base.

8. A computing device as described in claim 1, wherein the base is configured as a chassis including electronic componentry to provide at least some processing and memory resources for the computing device.

9. A computing device as described in claim 1, wherein the sliding feet comprises roller bearings.

10. A computing device as described in claim 1, wherein the tacky feet comprise rubber feet.

11. A computing device as described in claim 1, wherein the sliding feet and tacky feet are formed from different thermoplastic materials having different coefficients of friction.

12. A computing device as described in claim 1, wherein each foot of the arrangement of feet is further configured to act as a pivot, such that the base is base rotatable around each foot.

13. A computing device as described in claim 1, wherein the base is rectangular and the arrangement of feet includes sliding feet placed in corners along a side of base and tacky feet placed in corners along an opposing side of the base.

14. A computing device as described in claim 1, wherein the display device and base are physically and communicatively coupled one to another via the hinge mechanism.

15. A computing device as described in claim 1, wherein:
the upright position comprises a position in which the display device is raised to an upright angle above the base for vertical interaction; and
the laid-down position comprises a position in which the display device is lowered to a flat angle over the base for horizontal interaction.

16. A system comprising:
a base and a display device connected to the base by a hinge mechanism operable to position the display device into multiple positions relative to the base;
an arrangement of feet disposed on an underside of the base, the arrangement of feet configured to:
facilitate sliding of the base across a surface upon which the base rests when pressure is applied to the hinge mechanism to transition between the multiple positions; and
resist sliding of the base across the surface in an absence of pressure applied to the hinge mechanism.

17. A system as described in claim 16, wherein the arrangement of feet includes:
portions of sliding material engaged when pressure is applied to the hinge mechanism during transitions between the multiple positions to enable sliding of the base forward and back across the surface;
portions of tacky material engaged to keep the base from sliding in the absence of pressure applied to the hinge mechanism.

18. A system as described in claim 17, wherein at least one foot of the arrangement of feet includes both sliding material and tacky material, the tacky material in contact with the surface in the absence of applied pressure, the at least one foot deformable under applied pressure to drive the sliding material into contact with the surface thereby enabling the sliding of the base.

19. An apparatus comprising:
a base and a display device connected to the base by a hinge mechanism operable to position the display device into multiple positions relative to the base, the multiple positions including at least an upright position and a laid-down position;
one or more sliding feet arranged on an underside of the base along a rear edge of the base opposite from a front side of the apparatus, the sliding feet configured to engage and facilitate sliding of the base across a surface upon which the apparatus rests when pressure is applied to the hinge mechanism to transition between the upright position and the laid-down position;
one or more tacky feet arranged on the underside of the base along a front edge of the base on the front side of apparatus, the tacky feet configured to engage and resist sliding of the base across the surface in an absence of pressure applied to the hinge mechanism; and
a stop mechanism configured to limit a distance the base is able to travel across the surface during transitions between the multiple positions.

20. The apparatus as described in claim 19, wherein the sliding feet and tacky feet are formed from different thermoplastic materials having different coefficients of friction.

21. An apparatus comprising:
a base and a display device connected to the base by a hinge mechanism operable to position the display device into multiple positions relative to the base, the multiple positions including at least an upright position and a laid-down position;
an arrangement of feet disposed on an underside of the base, the arrangement of feet including a foot that includes:
a slidable portion configured to engage and facilitate sliding of the base across an adjacent surface upon which the apparatus rests when pressure is applied to the hinge mechanism to transition between the upright position and the laid-down position; and
a tacky portion configured to engage and resist sliding of the base across the adjacent surface when pressure is applied to the display device in the laid-down position.

22. An apparatus as described in claim 21, wherein the slidable portion and the tacky portion are formed from different respective materials of the foot.

23. An apparatus as described in claim 21, wherein:
in an absence of pressure applied to the hinge mechanism, a majority of contact between the foot and the adjacent surface occurs with the tacky portion; and
when pressure is applied to the hinge mechanism, a majority of contact between the foot and an adjacent surface occurs with the slidable portion.

* * * * *